(12) United States Patent
Seo et al.

(10) Patent No.: US 10,692,586 B2
(45) Date of Patent: Jun. 23, 2020

(54) SEMICONDUCTOR DEVICE

(71) Applicant: SK hynix Inc., Icheon-si Gyeonggi-do (KR)

(72) Inventors: Jae Hwan Seo, Icheon-si (KR); Sung Soo Chi, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/212,520

(22) Filed: Dec. 6, 2018

(65) Prior Publication Data

US 2020/0043566 A1 Feb. 6, 2020

(30) Foreign Application Priority Data

Aug. 1, 2018 (KR) .................. 10-2018-0089753

(51) Int. Cl.
*G11C 29/50* (2006.01)
*G11C 11/4074* (2006.01)
*G11C 11/4094* (2006.01)
*G11C 11/4091* (2006.01)
*G11C 11/4076* (2006.01)

(52) U.S. Cl.
CPC .... *G11C 29/50004* (2013.01); *G11C 11/4074* (2013.01); *G11C 11/4091* (2013.01); *G11C 11/4094* (2013.01); *G11C 11/4076* (2013.01); *G11C 2029/5004* (2013.01)

(58) Field of Classification Search
None
See application file for complete search history.

(56) References Cited

U.S. PATENT DOCUMENTS

| 5,469,393 A | * | 11/1995 | Thomann | ............... | G11C 29/04 365/190 |
| 9,318,169 B2 | | 4/2016 | Won et al. | | |
| 9,620,175 B2 | | 4/2017 | Takahashi | | |
| 2015/0016199 A1 | | 1/2015 | Won et al. | | |

FOREIGN PATENT DOCUMENTS

KR 1020150006662 A 1/2015

* cited by examiner

*Primary Examiner* — James G Norman
(74) *Attorney, Agent, or Firm* — William Park & Associates Ltd.

(57) ABSTRACT

A semiconductor device is disclosed, which is configured to perform a test using various conditions during a test mode. The semiconductor device includes a voltage generation circuit configured to output $2^n$ (n is an integer of $n \geq 2$) bit-line precharge voltages through different power-supply lines, based on a mode control signal, and a sense amplifier configured to receive the bit-line precharge voltages from the voltage generation circuit, and supply the $2^n$ bit-line precharge voltages to corresponding bit lines in units of $2^n$ successive bit-lines within the same cell array.

18 Claims, 9 Drawing Sheets

FIG. 1

| NO | VBLP3 | VBLP2 | VBLP1 | VBLP0 |
|---|---|---|---|---|
| 1 | VSS | VSS | VSS | VSS |
| 2 | VSS | VSS | VSS | VCORE |
| 3 | VSS | VSS | VCORE | VSS |
| 4 | VSS | VSS | VCORE | VCORE |
| 5 | VSS | VCORE | VSS | VSS |
| 6 | VSS | VCORE | VSS | VCORE |
| 7 | VSS | VCORE | VCORE | VSS |
| 8 | VSS | VCORE | VCORE | VCORE |
| 9 | VCORE | VSS | VSS | VSS |
| 10 | VCORE | VSS | VSS | VCORE |
| 11 | VCORE | VSS | VCORE | VSS |
| 12 | VCORE | VSS | VCORE | VCORE |
| 13 | VCORE | VCORE | VSS | VSS |
| 14 | VCORE | VCORE | VSS | VCORE |
| 15 | VCORE | VCORE | VCORE | VSS |
| 16 | VCORE | VCORE | VCORE | VCORE |

SEMICONDUCTOR DEVICE

CROSS-REFERENCE TO RELATED APPLICATION

The priority of Korean patent application No. 10-2018-0089753 filed on Aug. 1, 2018, the disclosure of which is hereby incorporated in its entirety by reference, is claimed.

BACKGROUND

1. Technical Field

Embodiments of the present disclosure generally relate to a semiconductor device, and more particularly to a semiconductor device capable of performing a test using various conditions during the test mode.

2. Related Art

A semiconductor device writes or reads data in or from memory cells using a sense amplifier. During a test mode, the semiconductor device writes or reads data in or from the memory cells using the sense amplifier. In addition, during the test mode, the semiconductor device has been designed to screen the memory cells using a high core voltage (Vcore).

However, when a high core voltage (Vcore) is used in a semiconductor device, a sense amplifier, especially, latch transistors contained in the sense amplifier, may unavoidably receive excessive stress during the test mode, such that there is a higher possibility of deteriorating the sense amplifier due to the excessive stress.

Meanwhile, in order to more effectively test the semiconductor device, many more test patterns capable of writing data are needed.

Therefore, a method for preventing deterioration of the sense amplifier and at the same time performing a test using various test patterns is needed.

SUMMARY

In accordance with an aspect of the present disclosure, a semiconductor device may include a voltage generation circuit configured to output $2^n$ (n is an integer of n≥2) bit-line precharge voltages through different power-supply lines, based on a mode control signal, and a sense amplifier configured to receive the bit-line precharge voltages from the voltage generation circuit, and supply the $2^n$ bit-line precharge voltages to corresponding bit lines in units of $2^n$ successive bit-lines within the same cell mat.

In accordance with an aspect of the present disclosure, a semiconductor device may include a cell mat configured to include a plurality of memory cells coupled to a plurality of bit lines, a first sense amplifier array located at one side of the cell mat, and coupled to odd bit lines from among the bit lines, a second sense amplifier array located at other side of the cell mat, and coupled to even bit lines from among the bit lines, and a voltage generation circuit configured to be coupled to the first sense amplifier array through different power-supply lines, be coupled to the second sense amplifier array through different power-supply lines, and output $2^n$ (where n is an integer of n≥2) bit-line precharge voltages to the first sense amplifier array and the second sense amplifier array based on a mode control signal.

DETAILED DESCRIPTION

Reference will now be made to certain embodiments, examples of which are illustrated in the accompanying drawings. Prior to description, the terms or words used in the disclosure and the claims are not interpreted as having general meanings or dictionary meanings, but should be interpreted as having meanings and concepts coinciding with the technical scope and sprit of the present disclosure. Therefore, the embodiments described in the specification and shown in the drawings are purely illustrative and are not intended to represent all aspects of the disclosure, such that various equivalents and modifications may be made without departing from the spirit of the disclosure.

Various embodiments of the present disclosure may be directed to providing a semiconductor device that substantially obviates one or more problems due to limitations and disadvantages of the related art.

An embodiment of the present disclosure may relate to a technology for preventing deterioration of a semiconductor device while simultaneously allowing the semiconductor device to be tested using various test patterns.

Figure 1:
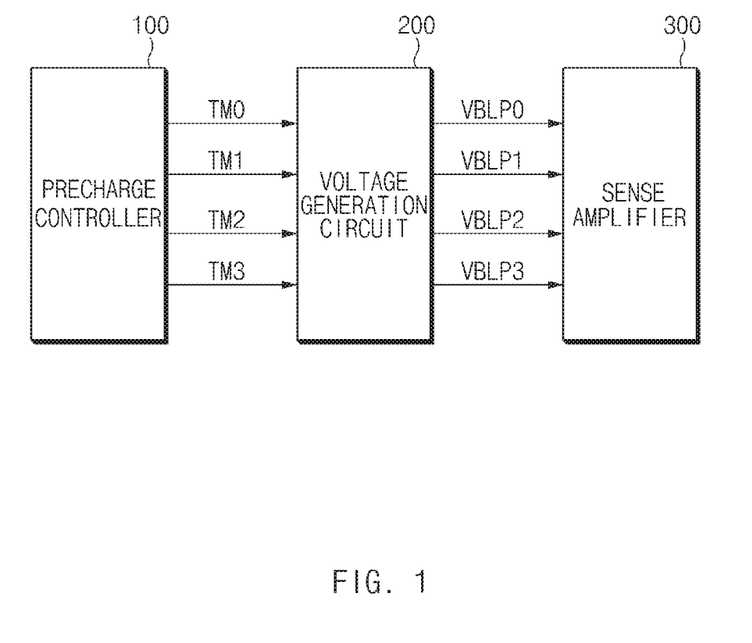
FIG. 1 is a schematic block diagram illustrating a representation of an example of a semiconductor device according to an embodiment of the present disclosure.

FIG. 1 is a schematic block diagram illustrating a semiconductor device according to an embodiment of the present disclosure.

Referring to FIG. 1, the semiconductor device may include a precharge controller 100, a voltage generation circuit 200, and a sense amplifier 300.

The precharge controller 100 may generate mode control signals TM0~TM3 for controlling magnitudes (i.e., voltage values) of first to fourth bit-line precharge voltages VBLP0~VBLP3 according to an operation mode (i.e., a normal mode or a test mode), and may output the generated mode control signals TM0~TM3 to the voltage generation circuit 200. The precharge controller 100 may adjust outputting of the mode control signals TM0~TM3 according to an operation mode of the semiconductor device.

For example, when data is written in the normal mode, the precharge controller 100 may control each of the first to fourth bit-line precharge voltages VBLP0~VBLP3 to reach a precharge voltage VBLP in a precharge period.

Figure 2:
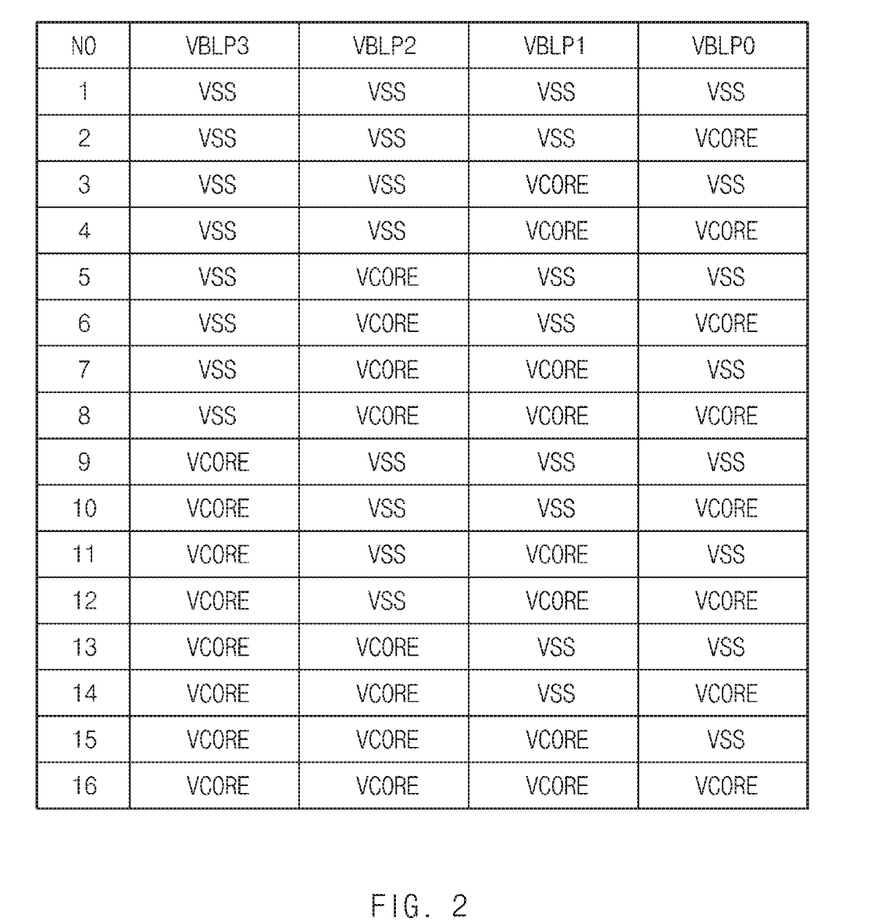
FIG. 2 is a diagram illustrating a representation of an example of 16 test voltage patterns capable of being implemented using four bit-line precharge voltages.

On the other hand, when data is written in the test mode, a core voltage VCORE, a precharge voltage VBLP, and/or a ground voltage VSS may be selectively output as the first to fourth bit-line precharge voltages VBLP0~VBLP3. For example, during the test mode, the precharge controller 100 may control mode control signals TM0~TM3 such that each of the first to fourth bit-line precharge voltages VBLP0~VBLP3 can reach the precharge voltage VBLP in the precharge period. When data for testing is written in memory cells during the test mode, the precharge controller 100 may control mode control signals TM0~TM3 in a manner that each of the first to fourth bit-line precharge voltages VBLP0~VBLP3 to reach a core voltage VCORE or a ground voltage VSS. In this case, as shown in FIG. 2, the precharge controller 100 may adjust or control the mode control signals TM0~TM3 in a manner that the first to fourth bit-line precharge voltages VBLP0~VBLP3 can be output in different ways according to 16(=2$^4$) different test voltage combinations. The operation for writing data using the first to fourth bit-line precharge voltages VBLP0~VBLP3 during the test mode will hereinafter be described.

The voltage generation circuit 200 may output the first to fourth bit-line precharge voltages VBLP0~VBLP3 upon receiving the mode control signals TM0~TM3 from the controller 100. For example, the voltage generation circuit 200 may output a core voltage VCORE, a precharge voltage VBLP, or a ground voltage VSS as a voltage value of each of the first to fourth bit-line precharge voltages VBLP0~VBLP3 according to the mode control signals TM0~TM3.

Figure 4:
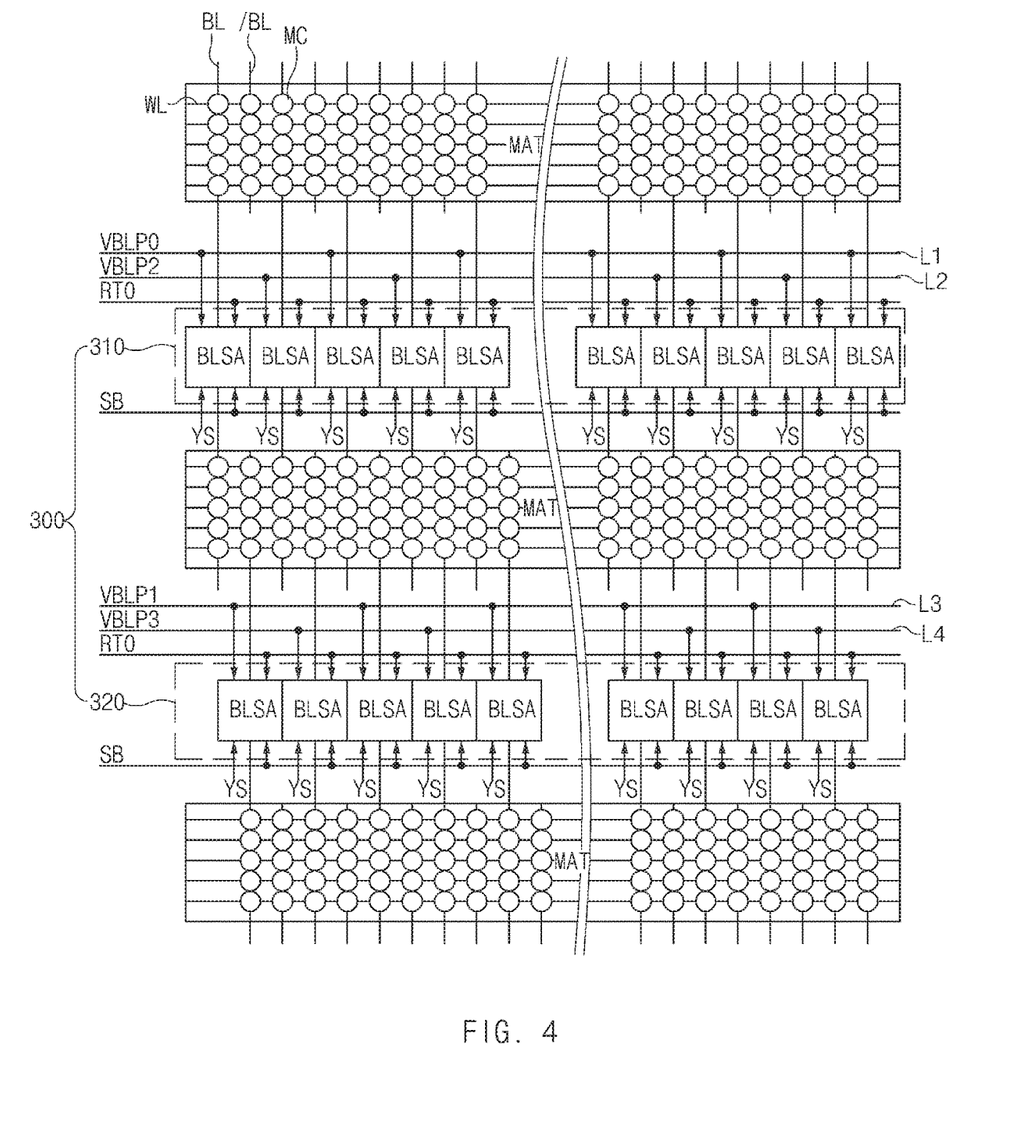
FIG. 4 is a schematic circuit diagram illustrating a representation of an example of a DRAM core including a sense amplifier shown in FIG. 1.

Referring to FIG. 4, the sense amplifier 300 may be coupled to the pair of bit lines of a cell array (cell mat) MAT, such that the sense amplifier 300 may write or read cell data in or from the cell mat MAT. During the normal mode, the sense amplifier 300 may write cell data in the cell mat MAT using a drive voltage and a column control signal YS that are received through a pull-up power line RTO and a pull-down power line SB. On the other hand, during the test mode, the sense amplifier 300 may write data for testing in the cell mat MAT upon receiving bit-line precharge voltages VBLP~VBLP3 from the voltage generation circuit 200.

For example, the sense amplifier 300 may provide the first to fourth bit-line precharge voltages VBLP0~VBLP3 in units of 4 successive bit-lines in the same cell mat.

Figure 3:
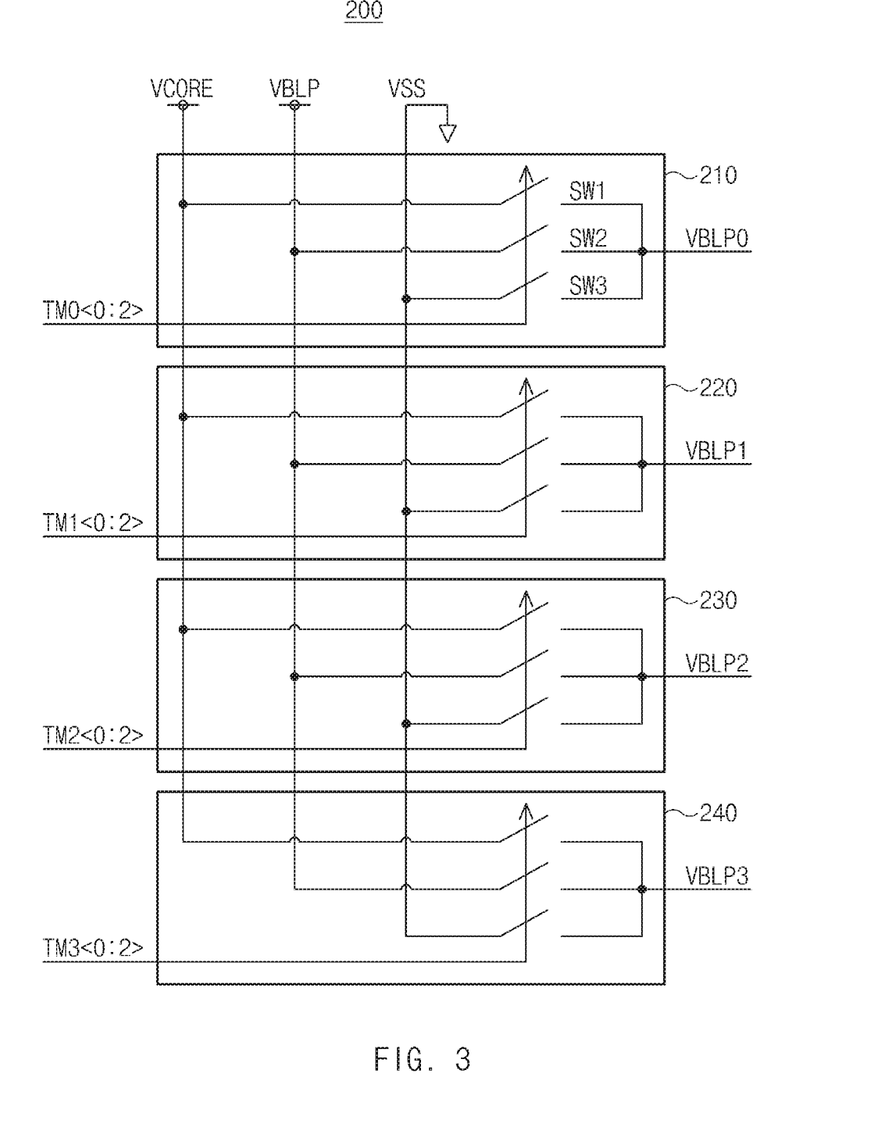
FIG. 3 is a circuit diagram illustrating a representation of an example of a voltage generation circuit shown in FIG. 1.

FIG. 3 is a circuit diagram illustrating an example of the voltage generation circuit shown in FIG. 1.

Referring to FIG. 3, the voltage generation circuit 200 may include a plurality of precharge voltage generators 210~240.

Each of the precharge voltage generators 210~240 may receive a core voltage VCORE, a precharge voltage VBLP, or a ground voltage VSS. Upon receiving the mode control signals TM0~TM3 from the precharge controller 100, each of the precharge voltage generators 210~240 may output any one of the core voltage VCORE, the precharge voltage VBLP, and the ground voltage VSS as a voltage value of each of the bit-line precharge voltages VBLP0~VBLP3.

For example, the precharge voltage generators 210 may output any one of the precharge voltage VBLP and the ground voltage VSS as the first bit-line precharge voltage VBLP0. In this case, a voltage value of the first bit-line precharge voltage VBLP0 may be controlled by the first mode control signal TM0. Likewise, the precharge voltage generator 220 may output any one of the core voltage VCORE, the precharge voltage VBLP, and the ground voltage VSS as the second bit-line precharge voltage VBLP1, upon receiving the second mode control signal TM1. The precharge voltage generator 230 may output any one of the core voltage VCORE, the precharge voltage VBLP, and the ground voltage VSS as the third bit-line precharge voltage VBLP2, upon receiving the third mode control signal TM2. The precharge voltage generator 240 may output any one of the core voltage VCORE, the precharge voltage VBLP, and the ground voltage VSS as the fourth bit-line precharge voltage VBLP3, upon receiving the fourth mode control signal TM3.

Each of the precharge voltage generators 210~240 may include switching elements SW1~SW3. Each of the switching elements SW1~SW3 may be located at a transmission path of the core voltage VCORE, the precharge voltage VBLP, and the ground voltage VSS, and may be turned on or off according to the mode control signals TM0~TM3. In this case, each of the switching elements SW1~SW3 may include a metal oxide semiconductor (MOS) transistor.

Each of the mode control signals TM0~TM3 may include 3-bit (i.e., <0:2>) signals for controlling on/off operations of the switching elements SW1~SW3 contained in each of the precharge voltage generators 210~240. That is, the switching elements (i.e., switches) SW1~SW3 of the precharge voltage generator 210 may be turned on or off according to 3-bit mode control signals TM0<0:2>, and the switching elements (i.e., switches) SW1~SW3 of the precharge voltage generator 220 may be turned on or off according to 3-bit mode control signals TM1<0:2>. The switching elements (i.e., switches) SW1~SW3 of the precharge voltage generator 230 may be turned on or off according to 3-bit mode control signals TM2<0:2>, and the switching elements (i.e., switches) SW1~SW3 of the precharge voltage generator 240 may be turned on or off according to 3-bit mode control signals TM3<0:2>.

FIG. 4 is a schematic circuit diagram illustrating an example of a DRAM core including the sense amplifier shown in FIG. 1.

Referring to FIG. 4, the DRAM core may include a plurality of cell mats MATs and a plurality of sense amplifier (sense-amp) arrays 310 and 320.

Each of the cell mats MATs may include a plurality of memory cells MCs that are located at intersection regions of word lines WLs and bit lines BL and /BL and are arranged in a matrix shape. The memory cells MCs may be interconnected through bit-line sense amplifiers BLSAs and bit lines BL and /BL of the sense amplifier arrays 310 and 320 located at both sides of the corresponding cell mat MAT.

The sense amplifier 300 may include the sense amplifier arrays 310 and 320. The sense amplifier arrays 310 and 320 may be located at both sides of the cell mat MAT, and may include a plurality of bit-line sense amplifiers BLSAs. Each bit-line sense amplifier BLSA may be coupled to the pair of bit lines BL and /BL such that the bit-line sense amplifier BLSA may write or read data in or from the cell mat MAT.

Specifically, for example, each of the sense amplifier arrays 310 and 320 may receive two bit-line precharge voltages (VBLP0, VBLP2) or (VBLP1, VBLP3) from the voltage generation circuit 200 through two different power-supply lines (L1, L2) or (L3, L4). For example, the sense amplifier array 310 located at one side of the cell mat (MAT)

may receive bit-line precharge voltages VBLP0 and VBLP2 through two different power-supply lines L1 and L2, and the sense amplifier array 320 located at the other side of the cell mat (MAT) may receive bit-line precharge voltages VBLP1 and VBLP3 through two different power-supply lines L3 and L4. In other words, four bit-line precharge voltages VBLP0~VBLP3 may be supplied to a single cell mat MAT, and the four bit-line precharge voltages VBLP0~VBLP3 may be supplied to the sense amplifier arrays 310 and 320 through different power-supply lines L1~L4, respectively.

In this case, each of the sense amplifier arrays 310 and 320, the bit-line sense amplifiers BLSAs located adjacent to one another may be coupled to different power-supply lines. For example, in the sense amplifier array 310, odd bit-line sense amplifiers BLSAs may be coupled to the power-supply line L1 such that the odd bit-line sense amplifiers BLSAs may receive the first bit-line precharge voltage VBLP0, and even bit-line sense amplifiers BLSAs may be coupled to the power-supply line L2 such that the even bit-line sense amplifiers BLSAs may receive the third bit-line precharge voltage VBLP2. In the sense amplifier array 320, odd bit-line sense amplifiers BLSAs may be coupled to the power-supply line L3 such that the odd bit-line sense amplifiers BLSAs may receive the second bit-line precharge voltage VBLP1, and even bit-line sense amplifiers BLSAs may be coupled to the power-supply line L4 such that the even bit-line sense amplifiers BLSAs may receive the fourth bit-line precharge voltage VBLP3.

Therefore, the bit lines BL and /BL of the cell mat MAT may receive the first to fourth bit-line precharge voltages VBLP0~VBLP3 in units of 4 successive bit-lines.

Figure 5:
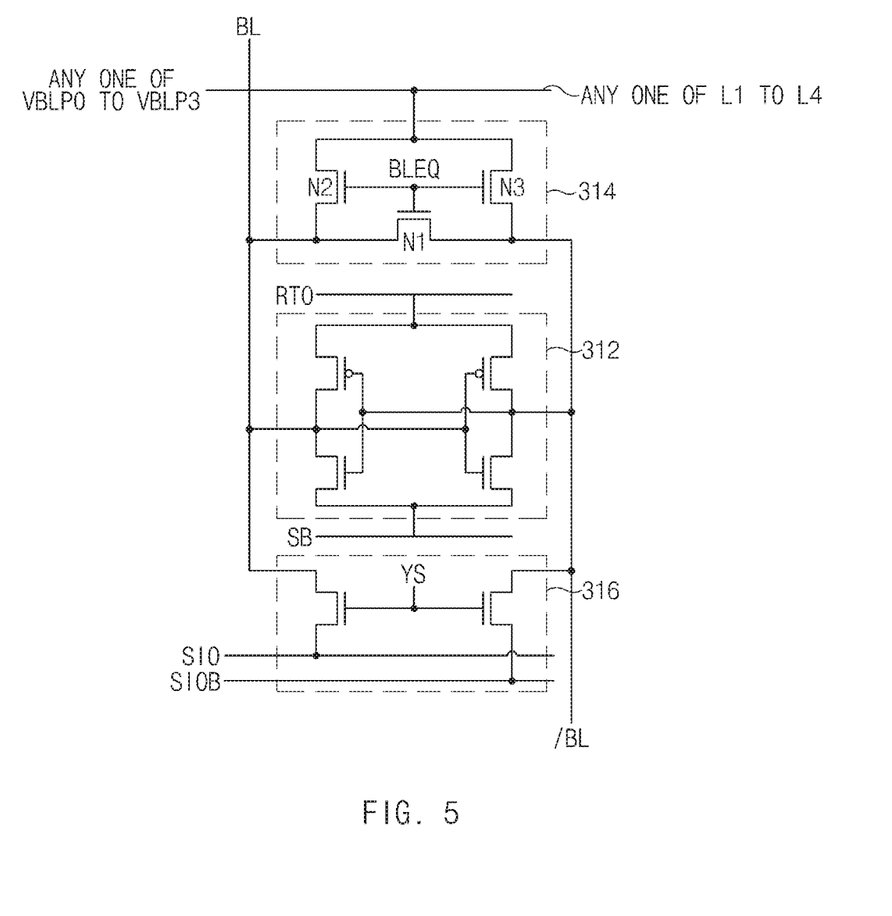
FIG. 5 is a diagram illustrating a representation of an example of a bit-line sense amplifier (BLSA) corresponding to a unit sense-amplifier shown in FIG. 4.

FIG. 5 is a diagram illustrating the bit-line sense amplifier (BLSA) (also called a unit sense-amplifier) shown in FIG. 4.

Referring to FIG. 5, each bit-line sense amplifier BLSA may include a sense amplifier circuit 312, an equalizing circuit 314, and a data output circuit 316. The sense amplifier circuit 312 may operate by a drive voltage received through the pull-up power-supply line RTO and the pull-down power-supply line SB, and may sense and amplify a difference in signal between the pair of bit lines BL and /BL. The equalizing circuit 314 may transmit the bit-line precharge voltage (any one of VBLP0 to VBLP3) to the pair of bit lines BL and /BL, upon receiving a bit-line equalizing signal BLEQ. The data output circuit 316 may selectively couple the pair of bit lines BL and /BL to the pair of input/output (I/O) lines SIO and SIOB, upon receiving a column selection signal YS.

The equalizing circuit 314 may include a plurality of transistors N1~N3. The transistor N1 may be coupled between the pair of bit lines BL and /BL, and may receive the bit-line equalizing signal BLEQ through a gate terminal thereof. The transistor N2 may be coupled between the bit-line precharge voltage (any one of VBLP0 to VBLP3) and the bit line BL, and may receive the equalizing signal BLEQ through a gate terminal thereof. The transistor N3 may be coupled between the bit-line precharge voltage (any one of VBLP0 to VBLP3) and the bit line /BL, and may receive the equalizing signal BLEQ through a gate terminal thereof. In this case, the bit-line precharge voltage applied to the equalizing circuit 314 of each bit-line sense amplifier BLSA may be any one of the four bit-line precharge voltages VBLP0~VBLP3 according to the position of the corresponding bit-line sense amplifier BLSA.

Figure 6:
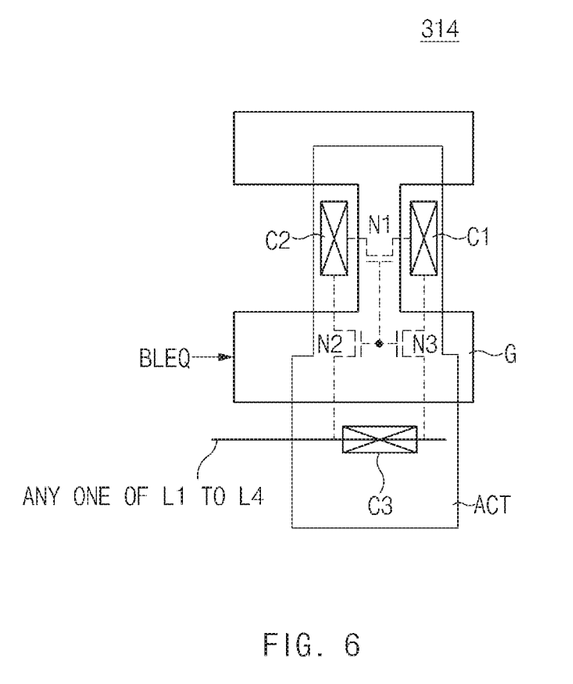
FIG. 6 is a diagram illustrating a representation of an example of a physical arrangement structure of transistors contained in an equalizing circuit of the bit-line sense amplifier (BLSA) corresponding to a unit sense-amplifier shown in FIG. 5.
Figure 7:
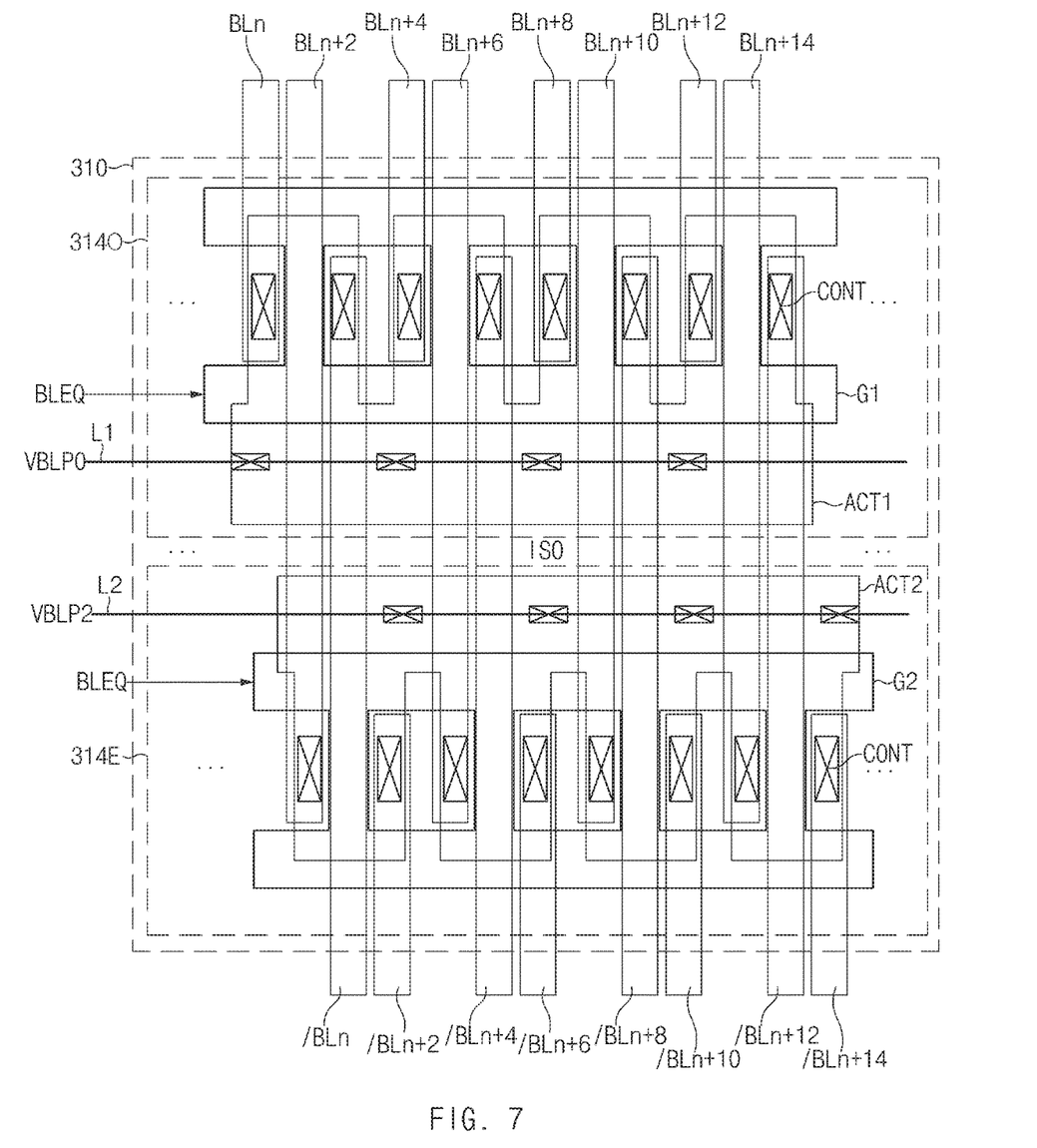
FIG. 7 is a diagram illustrating a representation of an example of a physical coupling structure of equalizing circuits and bit-line pairs in sense amplifier arrays shown in FIG. 4.

FIG. 6 is a diagram illustrating an example of a physical arrangement structure of transistors contained in the equalizing circuit 314 of the bit-line sense amplifier (BLSA) (also called a unit sense-amplifier) shown in FIG. 5. FIG. 7 is a diagram illustrating an example of a physical coupling structure of equalizing circuits and the pairs of bit-lines (hereinafter referred to as bit-line pairs) in sense amplifier arrays shown in FIG. 4.

The transistors N1~N3 denoted by dotted lines in FIG. 6 are illustrated to be compared with the transistors N1~N3 contained in the equalizing circuit 314 of FIG. 5. For convenience of description, FIG. 7 illustrates, for example, only the equalizing circuits of the respective bit-line sense amplifiers BLSAs for use in the sense amplifier array 310.

Referring to FIG. 6, the transistors N1~N3 of the equalizing circuit 314 of each bit-line sense amplifier BLSA may be formed in the same active region ACT. An H-shaped gate G may be formed in the active region ACT, and the bit-line equalizing signal BLEQ may be applied to the gate G. A plurality of contacts C1~C3 may be formed in the active region ACT that is spaced apart from the gate G by a predetermined distance. In this case, the contacts C1 and C2 may be coupled to the pair of bit lines BL and /BL, and the contact C3 may be coupled to the power-supply line (any one of L1 to L4) through which the bit line precharge voltage (any one of VBLP0 to VBLP3) is transmitted.

The word "predetermined" as used herein with respect to a parameter, such as a predetermined distance, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Referring to FIG. 7, equalizing circuits 3140 and 314E of the sense amplifier array 310 may be formed in a successive coupling structure of the equalizing circuit shown in FIG. 6.

However, the equalizing circuits 3140 and 314E of the sense amplifier array 310 may be respectively formed in two different active regions ACT1 and ACT2, such that the equalizing circuit 3140 is formed in one active region ACT1 and the other equalizing circuit 314E is formed in the other active region ACT2. For example, transistors contained in the equalizing circuit 3140 of each odd bit-line sense amplifier BLSA in the sense amplifier array 310 may be formed in the first active region ACT1, and transistors contained in the equalizing circuit 314E of each even bit-line sense amplifier BLSA in the sense amplifier array 310 may be formed in the second active region ACT2.

The active regions ACT1 and ACT2 may be formed to have a plurality of fingers formed by successive coupling of the active region ACT of FIG. 6. A ladder-shaped gate G1 formed by successive coupling of the H-shaped gate G of FIG. 6 may be formed in the active region ACT1, and a ladder-shaped gate G2 formed by successive coupling of the H-shaped gate G of FIG. 6 may be formed in the active region ACT2. The equalizing signal BLEQ may be applied to each of the gates G1 and G2. Contacts CONTs may be formed in the active regions ACT1 and ACT2 that are spaced apart from the gates G1 and G2 by a predetermined distance.

For example, the active regions ACT1 and ACT2 may be respectively coupled to the power-supply lines L1 and L2. For example, the active region ACT1 may be coupled to the power-supply line L1, and the active region ACT2 may be coupled to the power-supply line L2.

That is, the odd bit-line sense amplifiers BLSAs in the sense amplifier array 310 may receive the first bit-line precharge voltage VBLP0 through the power-supply line L1, and the even bit-line sense amplifiers BLSAs in the sense amplifier 310 may receive the third bit-line precharge voltage VBLP2 through the power-supply line L2.

Although FIG. 7 has, for example, disclosed only the sense amplifier array 310 for convenience of description, it should be noted that the sense amplifier array 320 has the same structure as the sense amplifier array 310. In other words, in the sense amplifier array 320, transistors contained in the equalizing circuit of each odd bit-line sense amplifier BLSA and other transistors contained in the equalizing circuit of each even bi-line sense amplifier BLSA may be formed in different active regions. In this case, the respective active regions may be coupled to different power-supply lines L3 and L4 (see FIG. 4), and may receive the second bit-line precharge voltage VBLP1 through the power-supply line L3 or may receive the fourth bit-line precharge voltage VBLP3 through the power-supply line L4.

Figure 8:
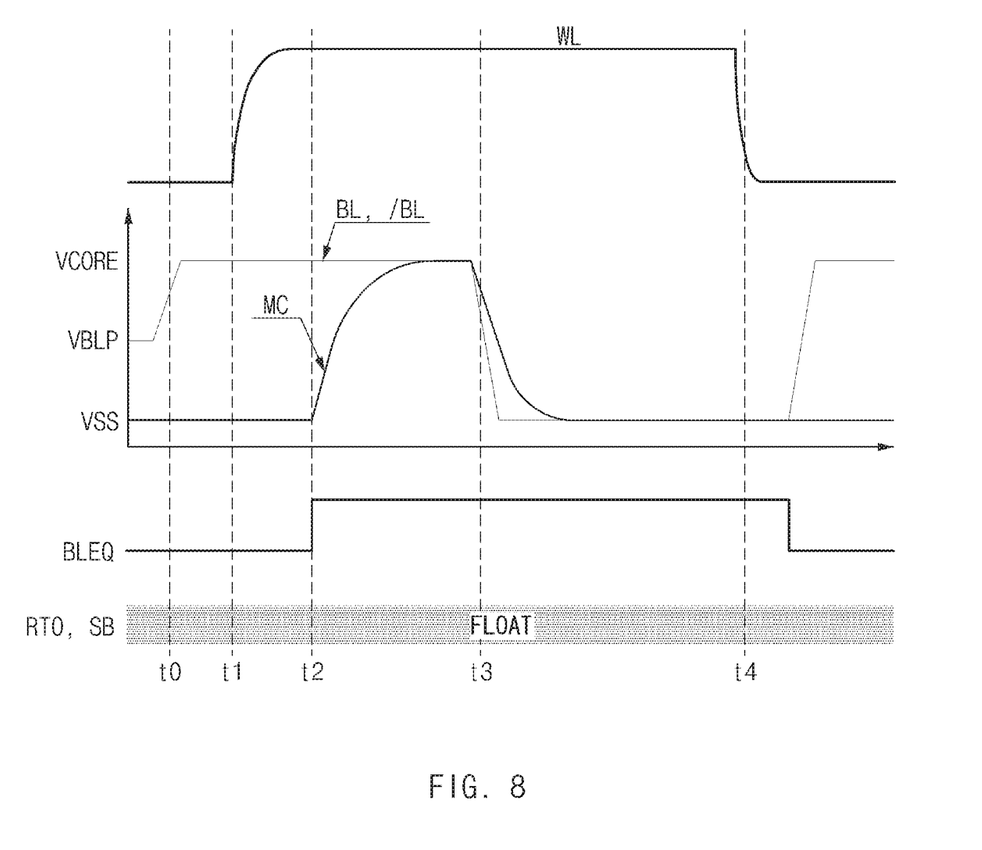
FIG. 8 is a timing diagram illustrating a representation of an example of a method for writing data using a bit line precharge voltage during a test mode according to an embodiment of the present disclosure.
Figure 9:
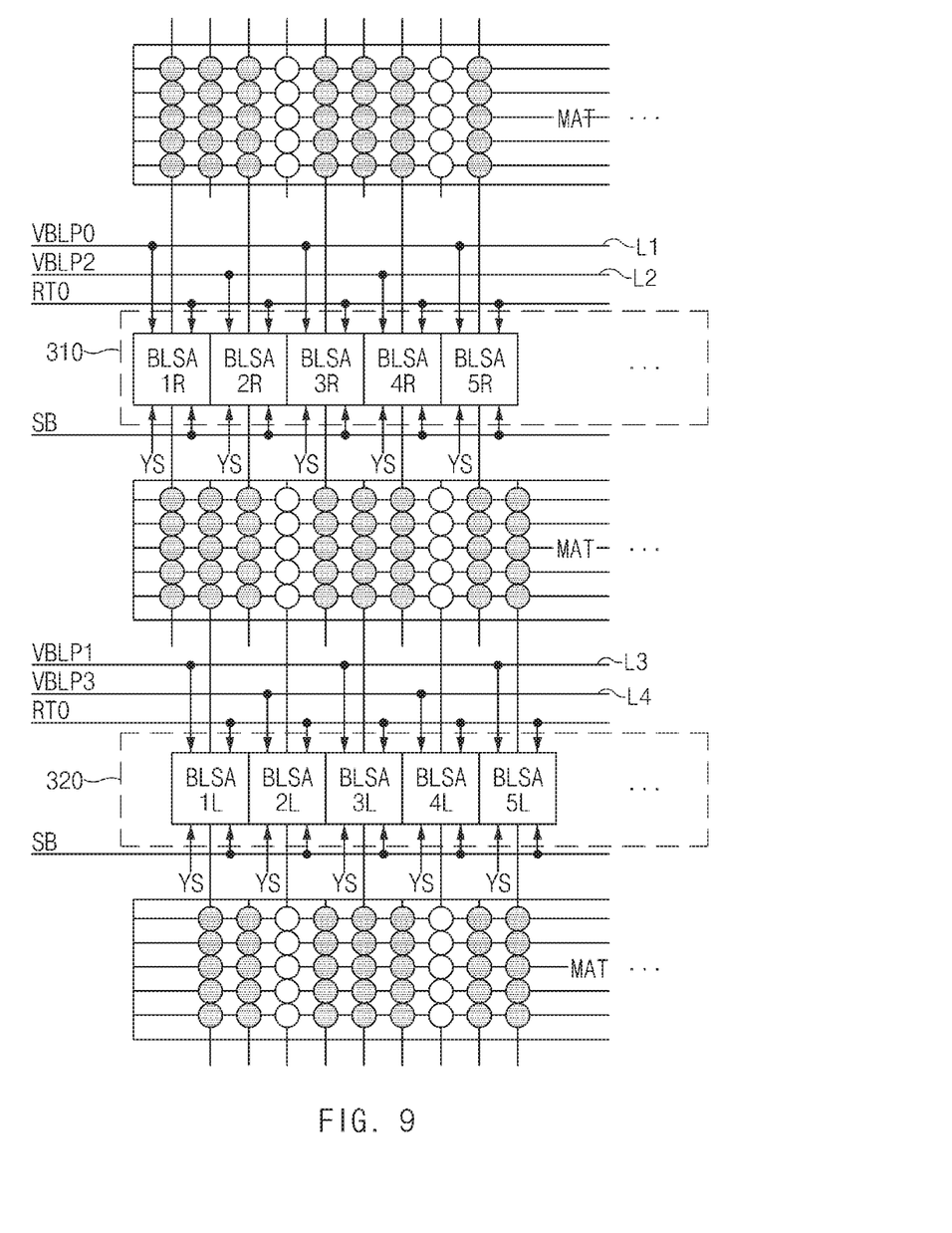
FIG. 9 is a conceptual diagram illustrating a representation of an example of a method for writing data in units of 4 bit lines within a cell mat (MAT) using 4 bit-line precharge voltages.

FIG. 8 is a timing diagram illustrating a method for writing data using the bit line precharge voltage during the test mode according to an embodiment of the present disclosure. FIG. 9 is a conceptual diagram illustrating a method for writing data in units of 4 bit lines within the cell mat (MAT) using 4 bit-line precharge voltages.

Referring to FIGS. 8 and 9, in the precharge period (i.e., in a time period before a time point 't0') prior to writing test data in each memory cell MC, the pair of bit lines BL and /BL coupled to the sense amplifier arrays 310 and 320 may be precharged with the precharge voltage VBLP. In this case, the precharge voltage VBLP may have the magnitude corresponding to ½ of the core voltage VCORE.

For this purpose, the precharge controller 100 (FIG. 1) may control the mode control signals TM0~TM3 in a manner that each of the precharge voltage generators 210~240 of the voltage generation circuit 200 (FIG. 3) is able to output the precharge voltage VBLP. That is, each of the first to fourth bit-line precharge voltages VBLP0~VBLP3 applied to the sense amplifier arrays 310 and 320 through the power-supply lines L1~L4 may be precharged with the precharge voltage VBLP (=VCORE/2).

Subsequently, at the time point 't0', the precharge controller 100 may supply the first to fourth bit-line precharge voltages VBLP0~VBLP3 in units of 4 successive bit-lines in the cell mat MAT, and may control the mode control signals TM0~TM3 in a manner that each of the bit-line precharge voltages VBLP0~VBLP3 has the core voltage VCORE or the ground voltage VSS.

For example, as illustrated in FIG. 9, the precharge controller 100 may supply the ground voltage VSS not only to the pair of bit lines coupled to the sense amplifier array 310, but also to the pair of bit lines coupled to the odd bit-line sense amplifiers BLSA 1L, BLSA 3L, and BLSA 5L of the sense amplifier array 320, and may control the mode control signals TM0~TM3 in a manner that the core voltage VCORE is supplied to the pair of bit lines coupled to the even bit-line sense amplifiers BLSA 2L and BLSA 4L of the sense amplifier array 320. That is, the precharge controller 100 may control the mode control signals TM0~TM3 in a manner that the precharge voltage generators 210, 220, 230, and 240 can respectively output the ground voltage VSS, the ground voltage VSS, the ground voltage VSS, and the core voltage VCORE.

Subsequently, at a time point 't1', the word line WL is activated to a high level in a manner that a capacitor of a memory cell is coupled to the bit lines. At a time point 't2', the bit-line equalizing signal BLEQ is activated to a high level, such that the bit-line precharge voltages VBLP0~VBLP3 applied to the sense amplifier arrays 310 and 320 may be supplied to the corresponding pair of bit lines. Therefore, the corresponding pair of bit lines and capacitors of memory cells coupled to the corresponding pair of bit lines may share charges therebetween. By such charge sharing, the memory cells coupled to the pair of bit lines receiving the core voltage VCORE may write data therein using the core voltage VCORE, as illustrated in FIG. 8. The memory cells coupled to the pair of bit lines receiving the core voltage VCORE may write data therein using the core voltage VCORE, as illustrated in FIG. 8. Subsequently, the memory cells coupled to the pair of bit lines receiving the ground voltage VSS may write data therein using the ground voltage VSS.

An embodiment of FIG. 9 has disclosed only an example in which, during the data write operation, each of the first to third bit-line precharge voltages VBLP0~VBLP2 reaches the ground voltage VSS and the fourth bit-line precharge voltage VBLP3 reaches the core voltage VCORE for convenience of description and better understanding of the present disclosure. However, the precharge controller 100 may control the mode control signals TM0~TM3 in a manner that the first to fourth bit-line precharge voltages VBLP0~VBLP2 can be combined with each other using 16 test patterns illustrated in FIG. 2.

At a time point 't3' after lapse of a predetermined time from completion of the data write operation, the precharge controller 100 may control or adjust the mode control signals TM0~TM3 in a manner that each of the first to fourth bit-line precharge voltages VBLP0~VBLP2 reaches the ground voltage VCORE. In other words, the precharge controller 100 may control the mode control signals TM0~TM3 in a manner that each of the precharge voltage generators 210~240 of the voltage generation circuit 200 outputs the ground voltage VSS. Therefore, the memory cell in which data corresponding to the core voltage VCORE has been written may re-transition to the ground voltage (VSS) level. Subsequently, at a time point 't4', the word line WL may transition to a low level, such that the write operation is completed.

The write operation for use in the above-mentioned test mode may be carried out using each of the 16 combinations illustrated in FIG. 2.

As described above, test voltages of the contiguous bit lines are changed in various ways such that many more various stresses can be applied to peripheral cells of a target memory cell. As a result, the embodiments of the present disclosure may test memory cells in many more various test environments.

Although an above-mentioned embodiment has disclosed only the example in which the voltage generation circuit 200 generates 4 bit-line precharge voltages VBLP0~VBLP3 for convenience of description, it should be noted that the voltage generation circuit 200 may generate many more bit-line precharge voltages as necessary. That is, many more bit-line precharge voltages are applied to the sense amplifier arrays located at both sides of the cell mat MAT, resulting in implementation of many more test environments. For example, if n/2 (where n is an integer of n≥2) bit-line precharge voltages are applied to each of the sense amplifier arrays located at both sides of the cell mat MAT, it is possible to implement a total of $2^n$ test environments. In this case, in each of the sense amplifier arrays located at both sides of the cell mat MAT, the active region in which transistors constructing the equalizing circuit are formed should be divided into a predetermined number of active regions corresponding to the number of bit-line precharge voltages applied to the active region.

As is apparent from the above description, the semiconductor devices according to the embodiments of the present disclosure may apply various stresses to peripheral cells of a target memory cell, such that the semiconductor device is able to test memory cells in various test environments.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor device comprising:
   a voltage generation circuit configured to output 2n (where n is an integer of n≥2) bit-line precharge voltages through different power-supply lines, based on a mode control signal; and
   a sense amplifier configured to receive the bit-line precharge voltages from the voltage generation circuit, and supply the 2n bit-line precharge voltages to corresponding bit lines in units of 2n successive bit-lines within a same cell array;
   wherein the sense amplifier additionally comprises:
   a first sense amplifier array located at one side of a cell array which receives a first plurality of bit-line precharge voltages from among the $2^n$ bit line precharge voltages through different power-supply lines, and supplies the first plurality of bit-line pre-charges voltage to the cell array; and
   second sense amplifier array located at the other side of the cell array which receives a second plurality of bit-line precharge voltages from among the $2^n$ bit-line precharge voltages through different power-supply lines and which supplies the second plurality of bit-line precharge voltages to the cell array.

2. The semiconductor device according to claim 1, wherein the voltage generation circuit includes:
   a first precharge voltage generator configured to output any one of first to third voltages having different magnitudes as a bit-line precharge voltage, upon receiving a first mode control signal;
   a second precharge voltage generator configured to output any one of the first to third voltages as a second bit-line precharge voltage, upon receiving a second mode control signal;
   a third precharge voltage generator configured to output any one of the first to third voltages as a third bit-line precharge voltage, upon receiving a third mode control signal; and
   a fourth precharge voltage generator configured to output any one of the first to third voltages as a fourth bit-line precharge voltage, upon receiving a fourth mode control signal.

3. The semiconductor device according to claim 2, wherein each of the first to fourth precharge voltage generators includes:
   a first switching element located at a transmission path of the first voltage, configured to be turned on or off based on the mode control signal;
   a second switching element located at a transmission path of the second voltage, configured to be turned on or off based on the mode control signal; and
   a third switching element located at a transmission path of the third voltage, configured to be turned on or off based on the mode control signal.

4. The semiconductor device according to claim 3, wherein each of the first to fourth mode control signals includes:
   3-bit signals configured to control on and off (on/off) operations of the first to third switching elements.

5. The semiconductor device according to claim 1, wherein the voltage generation circuit is configured to selectively output a core voltage, a precharge voltage, or a ground voltage as a voltage value of each of the 2n bit-line precharge voltages, upon receiving the mode control signal.

6. The semiconductor device according to claim 5, further comprising: a precharge controller configured to generate the mode control signal for controlling a magnitude of a bit-line precharge voltage according to an operation mode,
   wherein the precharge controller is configured to control the mode control signal in a manner that each of the 2n bit-line precharge voltages reaches the precharge voltage.

7. The semiconductor device according to claim 5, wherein the precharge controller, during a test mode, is configured to control the mode control signal in a manner that each of the 2n bit-line precharge voltages reaches the precharge voltage VBLP in a precharge period, and control the mode control signal in a manner that each of the 2n bit-line precharge voltages reaches the core voltage or the ground voltage in a data write period.

8. The semiconductor device according to claim 7, wherein the precharge controller is configured to control the mode control signal in a manner that each of the 2n bit-line precharge voltages reaches the ground voltage after lapse of a predetermined time from completion of the data write period.

9. The semiconductor device according to claim 1, wherein
   the first sense amplifier array is configured to receive odd bit-line precharge voltages from among the 2n bit-line precharge voltages, and
   the second sense amplifier array is configured to receive even bit-line precharge voltages from among the 2n bit-line precharge voltages, and supply the even bit-line precharge voltages to the cell array.

10. The semiconductor device according to claim 9, wherein the first sense amplifier array includes:
    a plurality of first unit sense amplifiers configured to receive a bit-line precharge voltage from the voltage generation circuit through a first power-supply line; and a plurality of third unit sense amplifiers configured to receive a bit-line precharge voltage from the voltage generation circuit through a second power-supply line.

11. The semiconductor device according to claim 10, wherein:
in the first unit sense amplifiers, transistors for supplying the bit-line precharge voltage to a pair of bit lines based on a bit-line equalizing signal are formed in a first active region coupled to the first power-supply line; and
in the third unit sense amplifiers, transistors for supplying the bit-line precharge voltage to a pair of bit lines based on the bit-line equalizing signal are formed in a second active region that is coupled to the second power-supply line while being spaced apart from the first active region by a predetermined distance.

12. The semiconductor device according to claim 9, wherein the second sense amplifier array includes:
a plurality of second unit sense amplifiers configured to receive a bit-line precharge voltage from the voltage generation circuit through a third power-supply line; and
a plurality of fourth unit sense amplifiers configured to receive a bit-line precharge voltage from the voltage generation circuit through a fourth power-supply line.

13. The semiconductor device according to claim 12, wherein:
in the second unit sense amplifiers, transistors for supplying the bit-line precharge voltage to a pair of bit lines based on a bit-line equalizing signal are formed in a third active region coupled to the third power-supply line; and
in the fourth unit sense amplifiers, transistors for supplying the bit-line precharge voltage to a pair of bit lines based on the bit-line equalizing signal are formed in a fourth active region that is coupled to the fourth power-supply line while being spaced apart from the third active region by a predetermined distance.

14. A semiconductor device comprising:
a cell array configured to include a plurality of memory cells coupled to a plurality of bit lines;
a first sense amplifier array located at one side of the cell array, and coupled to odd bit lines from among the bit lines;
a second sense amplifier array located at other side of the cell array, and coupled to even bit lines from among the bit lines; and
a voltage generation circuit configured to be coupled to the first sense amplifier array through different power-supply lines, be coupled to the second sense amplifier array through different power-supply lines, and output 2n (where n is an integer of n2) bit-line precharge voltages to the first sense amplifier array and the second sense amplifier array based on a mode control signal.

15. The semiconductor device according to claim 14, wherein the first sense amplifier array includes:
a plurality of first unit sense amplifiers configured to receive a bit-line precharge voltage from the voltage generation circuit through a first power-supply line; and
a plurality of third unit sense amplifiers configured to receive a bit-line precharge voltage from the voltage generation circuit through a second power-supply line.

16. The semiconductor device according to claim 15, wherein:
in the first unit sense amplifiers, transistors for supplying the bit-line precharge voltage to a pair of bit lines based on a bit-line equalizing signal are formed in a first active region coupled to the first power-supply line; and
in the third unit sense amplifiers, transistors for supplying the bit-line precharge voltage to a pair of bit lines based on the bit-line equalizing signal are formed in a second active region that is coupled to the second power-supply line while being spaced apart from the first active region by a predetermined distance.

17. The semiconductor device according to claim 14, wherein the second sense amplifier array includes:
a plurality of second unit sense amplifiers configured to receive a bit-line precharge voltage from the voltage generation circuit through a third power-supply line; and
a plurality of fourth unit sense amplifiers configured to receive a bit-line precharge voltage from the voltage generation circuit through a fourth power-supply line.

18. The semiconductor device according to claim 17, wherein: in the second unit sense amplifiers, transistors for supplying the bit-line precharge voltage to a pair of bit lines based on a bit-line equalizing signal are formed in a third active region coupled to the third power-supply line; and
in the fourth unit sense amplifiers, transistors for supplying the bit-line precharge voltage to a pair of bit lines based on the bit-line equalizing signal are formed in a fourth active region that is coupled to the fourth power-supply line while being spaced apart from the third active region by a predetermined distance.

* * * * *